(12) United States Patent
Asari

(10) Patent No.: US 9,048,418 B2
(45) Date of Patent: Jun. 2, 2015

(54) SENSOR ELEMENT, SENSOR DEVICE, AND ELECTRONIC APPARATUS

(71) Applicant: Seiko Epson Corporation, Tokyo (JP)

(72) Inventor: Tomotaka Asari, Chino (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 13/785,165

(22) Filed: Mar. 5, 2013

(65) Prior Publication Data

US 2013/0241353 A1    Sep. 19, 2013

(30) Foreign Application Priority Data

Mar. 13, 2012  (JP) ................. 2012-056457

(51) Int. Cl.
*H01L 41/113* (2006.01)
*G01C 19/5607* (2012.01)
*G01C 19/5621* (2012.01)

(52) U.S. Cl.
CPC ........ *H01L 41/1132* (2013.01); *G01C 19/5607* (2013.01); *G01C 19/5621* (2013.01)

(58) Field of Classification Search
CPC .......... H01L 41/1132; G01C 19/5607; G01C 19/5621
USPC ........................ 310/323.01–323.21, 338, 370
See application file for complete search history.

(56) References Cited

U.S. PATENT DOCUMENTS

| | | | |
|---|---|---|---|
| 6,227,048 B1 | 5/2001 | Kikuchi et al. | |
| 7,997,135 B2 | 8/2011 | Ashimori | |
| 8,065,914 B2 | 11/2011 | Kikuchi et al. | |
| 8,127,609 B2 | 3/2012 | Unno et al. | |
| 2005/0006988 A1* | 1/2005 | Kawauchi et al. | 310/367 |
| 2006/0202591 A1* | 9/2006 | Inaguma et al. | 310/348 |

FOREIGN PATENT DOCUMENTS

| | | |
|---|---|---|
| JP | 11-281372 | 10/1999 |
| JP | 2008-157707 | 7/2008 |
| JP | 2009-014584 | 1/2009 |
| JP | 2009-156832 | 7/2009 |
| JP | 2010-032482 | 2/2010 |
| JP | 2010-266321 | 11/2010 |

* cited by examiner

*Primary Examiner* — Derek Rosenau
(74) *Attorney, Agent, or Firm* — Harness, Dickey & Pierce, P.L.C.

(57) ABSTRACT

A sensor element includes a base part, a detection vibrating arm extended from the base part, and detection parts that are provided on the detection vibrating arm and detect flexural vibration of the detection vibrating arm, the detection parts each have a first electrode layer, a second electrode layer provided at an opposite side to the detection vibrating arm with respect to the first electrode layer, and a piezoelectric layer provided between the first electrode layer and the second electrode layer, and the detection parts have parts provided over boundary parts between the detection vibrating arm and the base part and the parts bend or curve to extend in a direction including a direction component orthogonal to an extension direction of the detection vibrating arm along side surfaces of the detection vibrating arm and the base part.

14 Claims, 12 Drawing Sheets

SENSOR ELEMENT, SENSOR DEVICE, AND ELECTRONIC APPARATUS

BACKGROUND

1. Technical Field

The present invention relates to a sensor element, a sensor device, and an electronic apparatus.

2. Related Art

Sensor elements that detect physical quantities such as angular velocities and acceleration are used for vehicle body control in vehicles, self-location detection of car navigation systems, vibration control correction of digital cameras, video cameras, etc. (so-called camera shake correction), for example. As an example of the sensor element, for example, a vibration gyro sensor (angular velocity sensor element) has been known (for example, see Patent Document 1 (JP-A-2009-156832)).

For example, the angular velocity sensor element disclosed in the patent document has a transmission arm (base part) fixed at both ends, four drive arms (drive vibrating arms) and two detection arms (detection vibrating arms) extending from the transmission arm, and pairs of piezoelectric elements each provided to each drive arm and each detection arm. Regarding the four drive arms, the two drive arms extend from one end part of the transmission arm in opposite directions, the other two drive arms extend from the other end parts of the transmission arm in opposite directions. Further, the two detection arms extend from the center part of the transmission arm in opposite directions.

In the angular velocity sensor element disclosed in Patent Document 1, by alternately repeating movements of expanding one piezoelectric element of the pair of piezoelectric elements of the drive arm and contracting the other piezoelectric element, the drive arm is flexurally vibrated (driven) to perform the so-called in-plane vibration. Further, when a predetermined angular velocity is applied in the drive state, flexural vibrations (in-plane vibrations) of the transmission arm and the detection arms are excited by Coriolis force, and electric charge is output from the pairs of piezoelectric elements of the detection arms. By detecting the electric charge, the angular velocity may be detected.

In related art, in the angular velocity sensor element, the pairs of piezoelectric elements provided on the detection arms have shapes simply and linearly extending in the extension directions of the detection arms, and thus, there has been a problem that it is impossible to efficiently detect the in-plane vibrations of the detection arms or sufficiently improve detection sensitivity.

SUMMARY

An advantage of some aspects of the invention is to provide a sensor element having advantageous detection sensitivity, and a sensor device and an electronic apparatus including the sensor device with advantageous reliability.

The invention can be implemented as the following forms or application examples.

Application Example 1

This application example of the invention is directed to a sensor element including a base part, a vibrating arm extended from the base part, a detection part that is provided on the vibrating arm and the base part and detects flexural vibration of the vibrating arm, wherein the detection part has a first electrode layer, a second electrode layer, and a piezoelectric layer provided between the first electrode layer and the second electrode layer, and the detection part bends or curves to extend in a direction including a direction component orthogonal to an extension direction of the vibrating arm along side surfaces of the vibrating arm and the base part.

According to the sensor element having the above described configuration, the detection part may not only output electric charge with stress of the vibrating arm itself by the flexural vibration of the vibrating arm but also output electric charge with stress of the base part by the flexural vibration of the vibrating arm. Accordingly, detection sensitivity of the sensor element may be made advantageous.

Application Example 2

In the sensor element according to the application example of the invention, it is preferable that an end of the detection part at the base part side is located at an outer side of the vibrating arm than a virtual surface formed by extending the side surface of the vibrating arm along the extension direction of the vibrating arm.

Thereby, the detection part may output electric charge with the stress of the base part by the flexural vibration of the vibrating arm.

Application Example 3

In the sensor element according to the application example of the invention, it is preferable that, given that a width of the vibrating arm is Ws and a distance between the virtual surface and the end of the detection part at the base part side is Ls, Ls/Ws is equal to or less than 1.2.

Thereby, the detection part may efficiently output electric charge with the stress of the base part by the flexural vibration of the vibrating arm.

Application Example 4

In the sensor element according to the application example of the invention, it is preferable that the detection part is provided so that a distance between the side surfaces of the vibrating arm and the base part and itself may be constant.

Thereby, the detection part may respectively efficiently output electric charge with the stress of the vibrating arm itself by the flexural vibration of the vibrating arm and the stress of the base part by the flexural vibration of the vibrating arm.

Application Example 5

In the sensor element according to the application example of the invention, it is preferable that a detection vibrating arm forming the vibrating arm, a drive vibrating arm extended from the base part, and a drive part that is provided on the drive vibrating arm and flexurally vibrates the drive vibrating arm are further provided.

Thereby, driving by the drive part and detection by the detection part may be respectively efficiently performed. As a result, the detection sensitivity of the sensor element may be improved.

Application Example 6

In the sensor element according to the application example of the invention, it is preferable that the drive part has a piezoelectric element that expands and contracts in an extension direction of the drive vibrating arm, and the drive part is provided on the drive vibrating arm and the base part, and bends or curves to extend in a direction including a direction component orthogonal to the extension direction of the drive vibrating arm along side surfaces of the drive vibrating arm and the base part.

Thereby, the drive vibrating arm may be efficiently flexurally vibrated. As a result, the detection sensitivity of the sensor element may be improved.

Application Example 7

In the sensor element according to the application example of the invention, it is preferable that the base part has a main body part, and a pair of connecting arms extended from the main body part in opposite directions, the drive vibrating arm is extended from each of the connecting arms in a direction crossing an extension direction of each of the connecting arms, and the detection vibrating arm is extended from the main body part in a direction crossing the extension direction of each of the connecting arms.

Thereby, the drive vibrating arm may be flexurally vibrated in an in-plane direction, and the flexural vibration of the detection vibrating arm in the in-plane direction may be excited by Coriolis force.

Application Example 8

This application example of the invention is directed to a sensor device including the sensor element according to the aspect of the invention.

Thereby, the sensor device having advantageous detection sensitivity may be provided.

Application Example 9

This application example of the invention is directed to an electronic apparatus including the sensor element according to the application example of the invention.

Thereby, the electronic apparatus having advantageous reliability may be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a sensor element, a sensor device, and an electronic apparatus of the invention will be explained in detail with reference to embodiments shown in the accompanying drawings.

Sensor Device

First Embodiment

First, a sensor device according to the first embodiment of the invention (sensor device including a sensor element according to the invention) will be explained.

Figure 1:
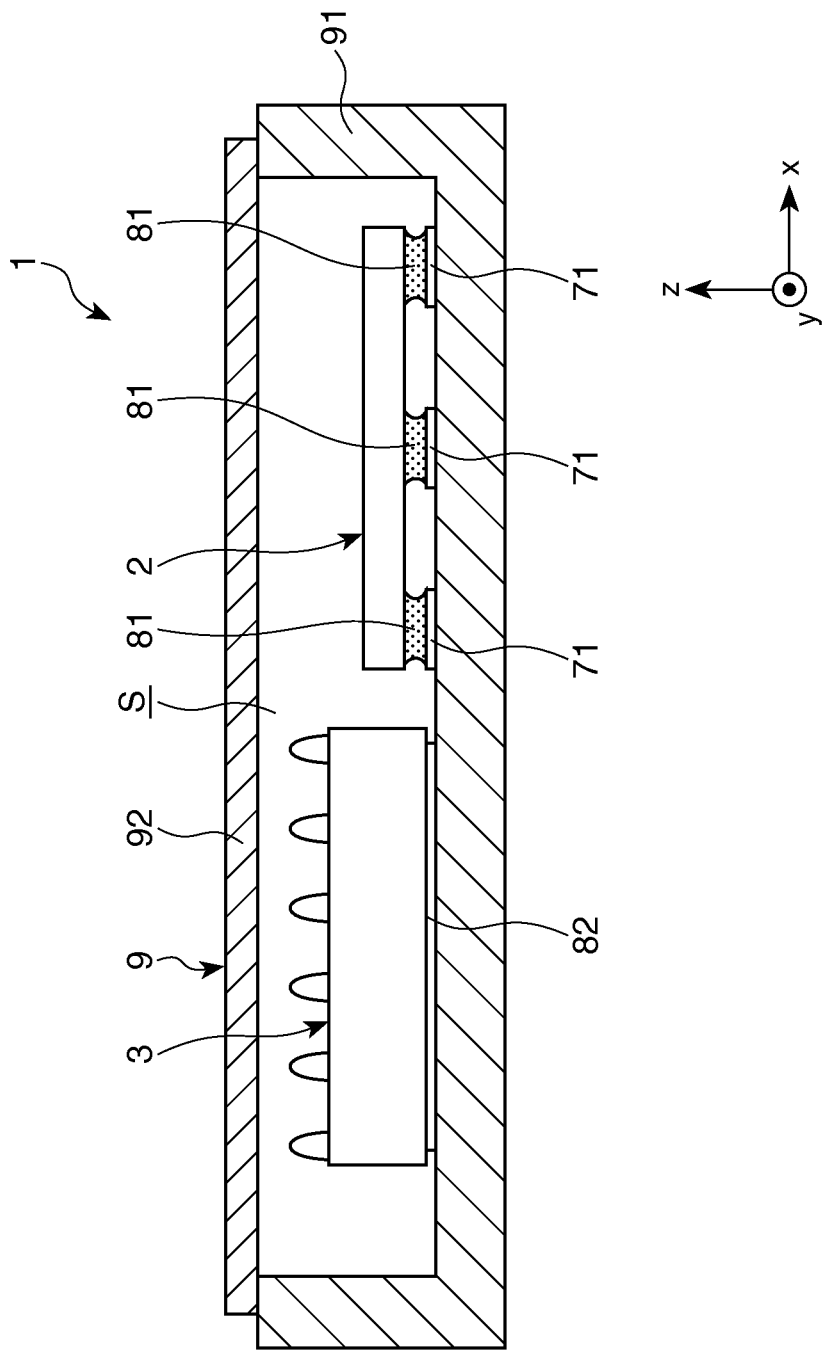
FIG. 1 is a sectional view showing a schematic configuration of a sensor device according to a first embodiment of the invention.
Figure 2:
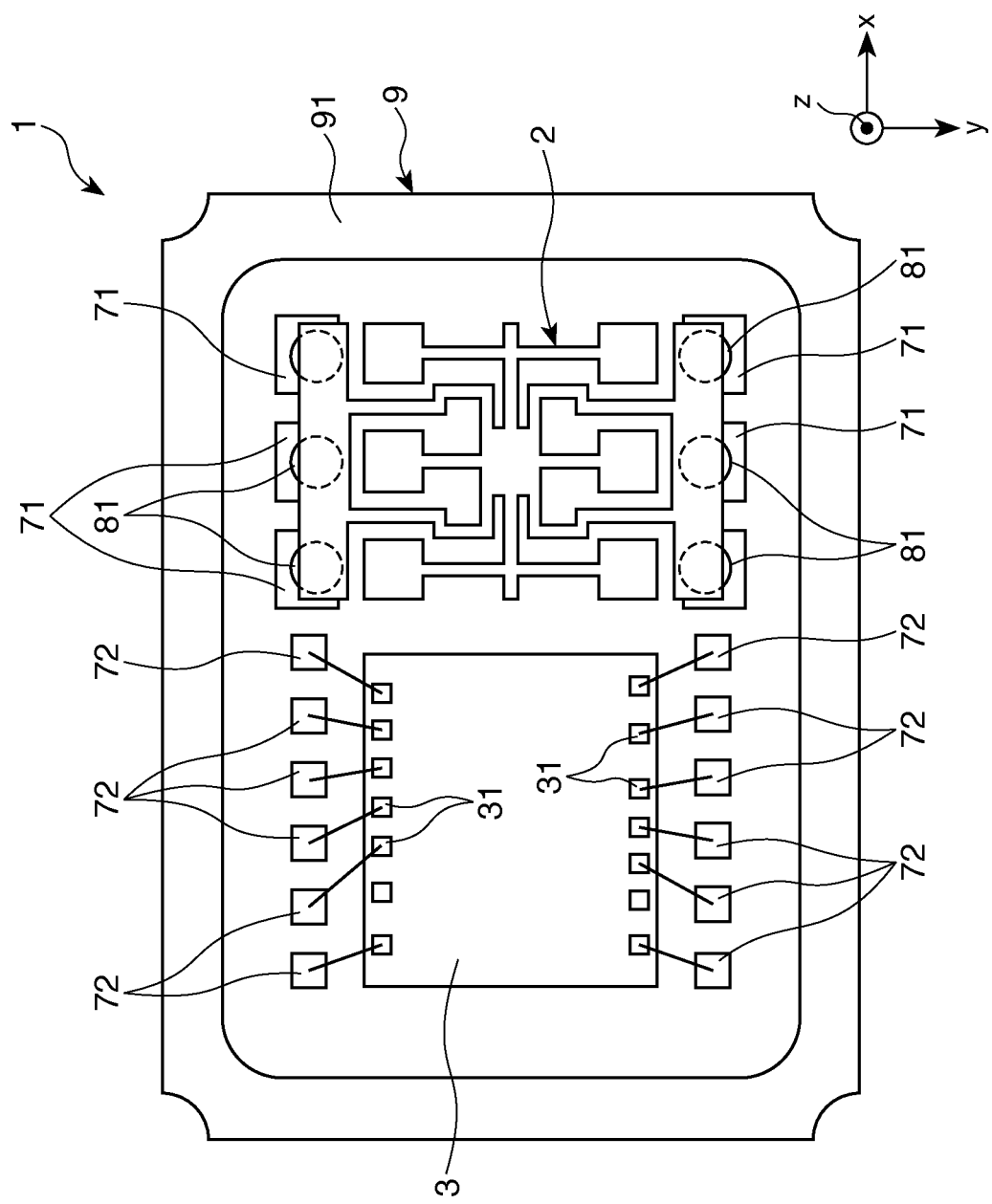
FIG. 2 is a plan view of the sensor device shown in FIG. 1.
Figure 3:
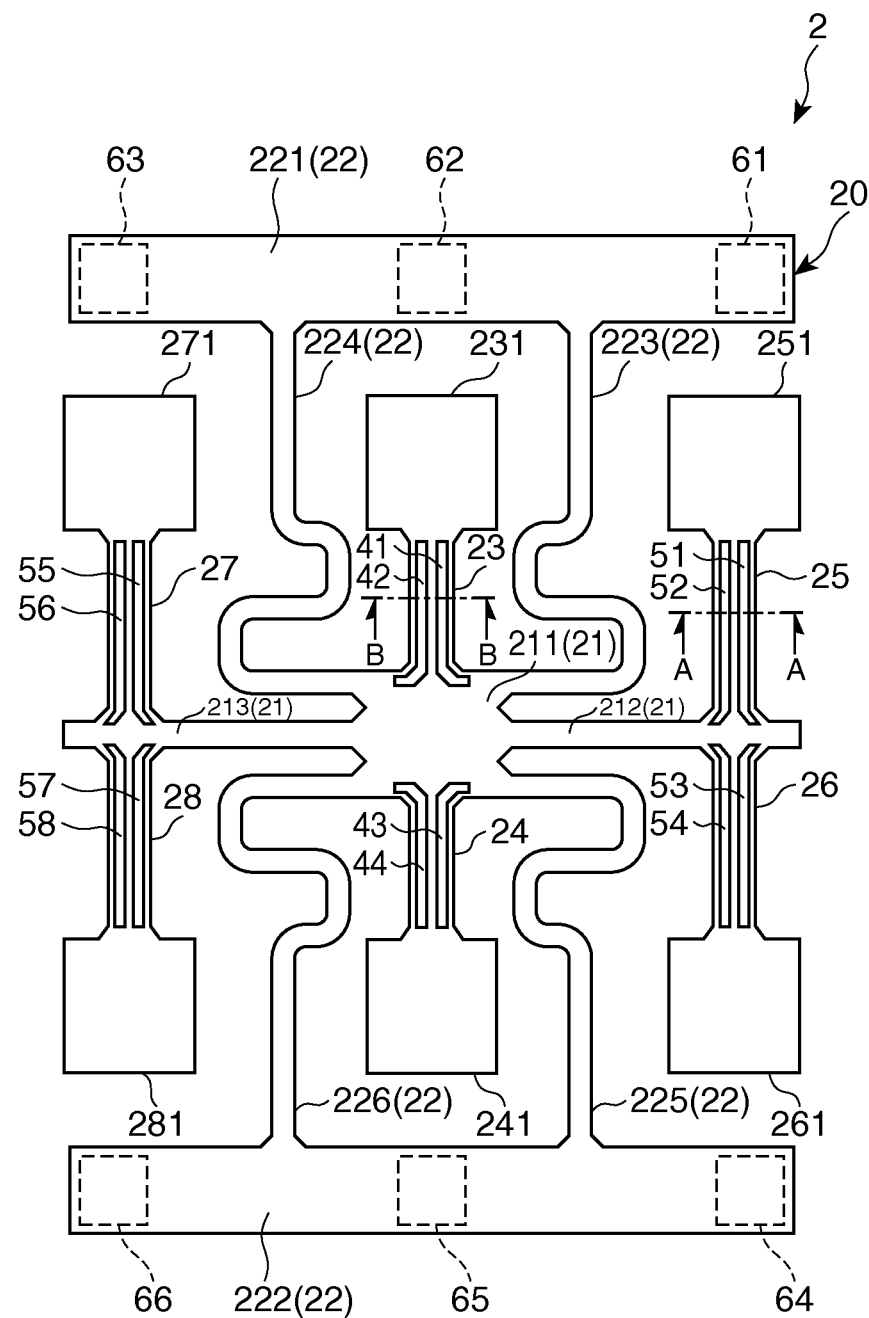
FIG. 3 is a plan view of a sensor element of the sensor device shown in FIG. 1.
Figure 4A:
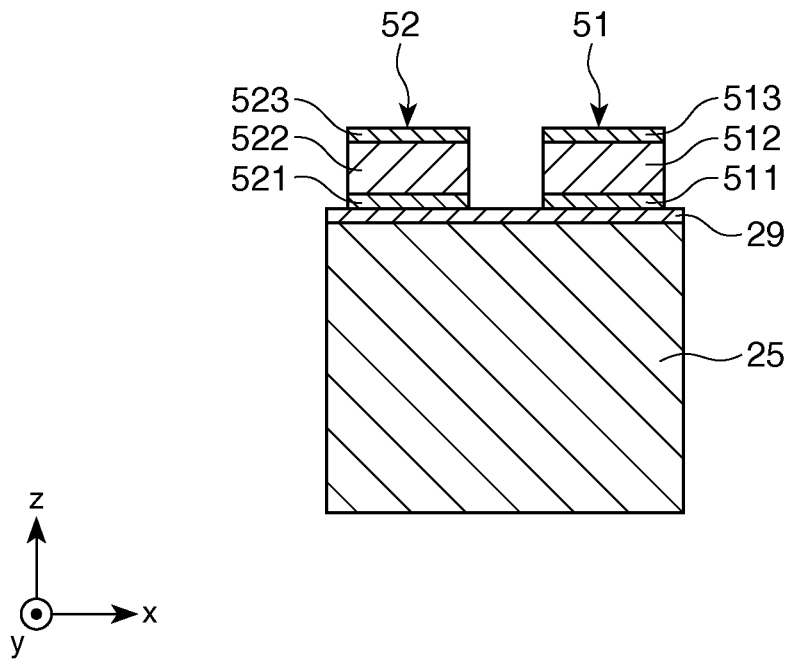
FIG. 4A is a sectional view along A-A line in FIG. 3.
Figure 4B:
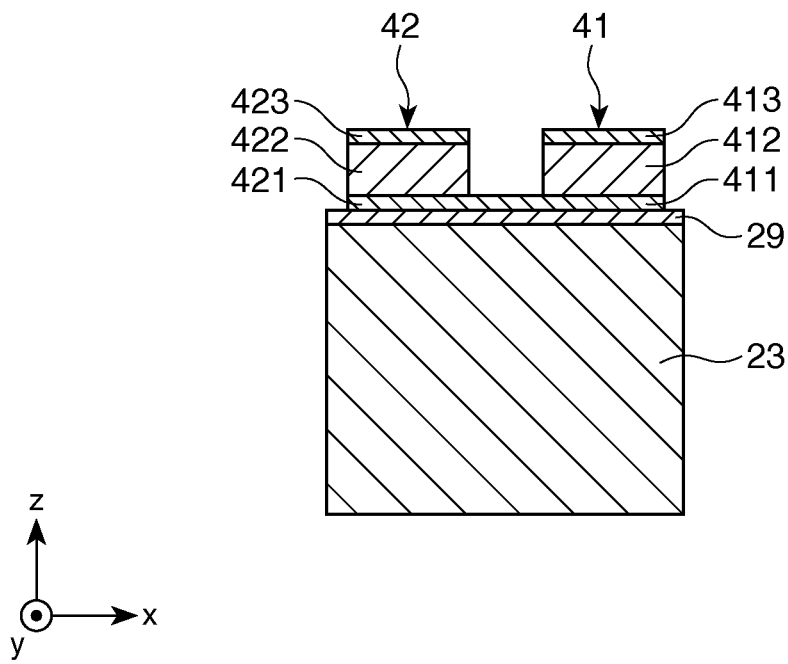
FIG. 4B is a sectional view along B-B line in FIG. 3.
Figure 5:
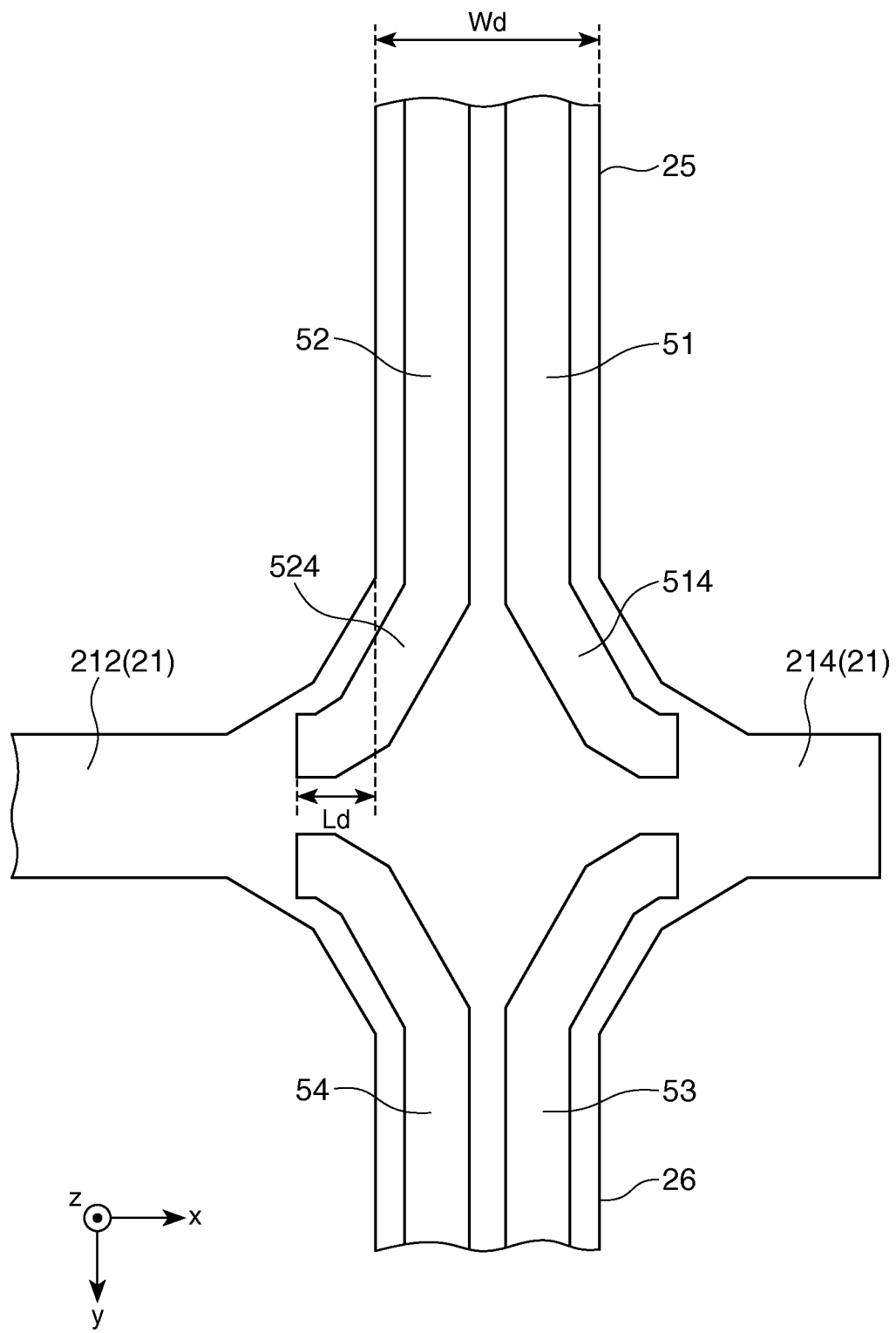
FIG. 5 is a partially enlarged plan view for explanation of a drive part of the sensor element shown in FIG. 3.
Figure 6:
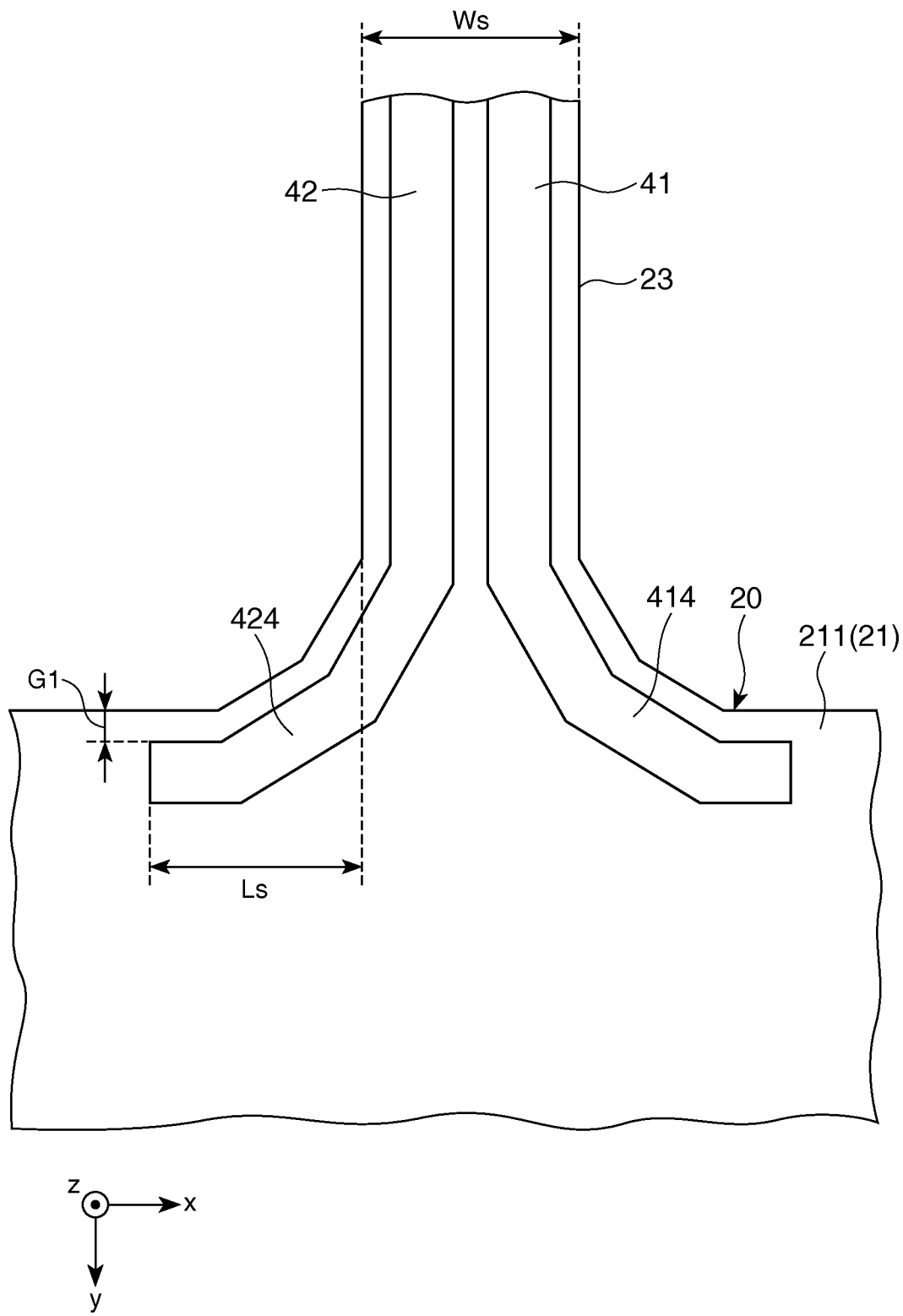
FIG. 6 is a partially enlarged plan view for explanation of a detection part of the sensor element shown in FIG. 3.
Figure 7B:
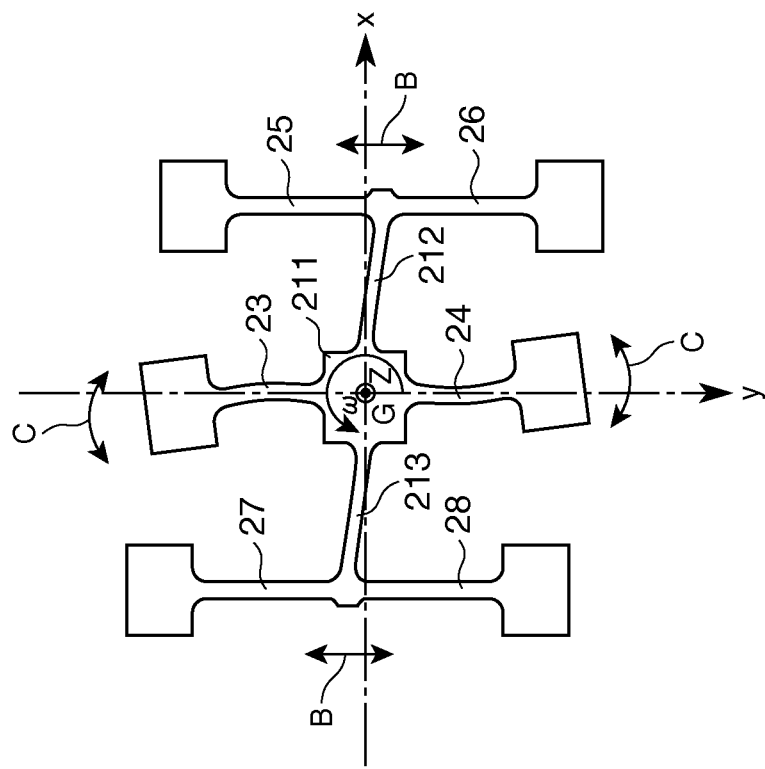
FIGS. 7A and 7B are plan views for explanation of driving of the sensor element shown in FIG. 3.
Figure 7A:
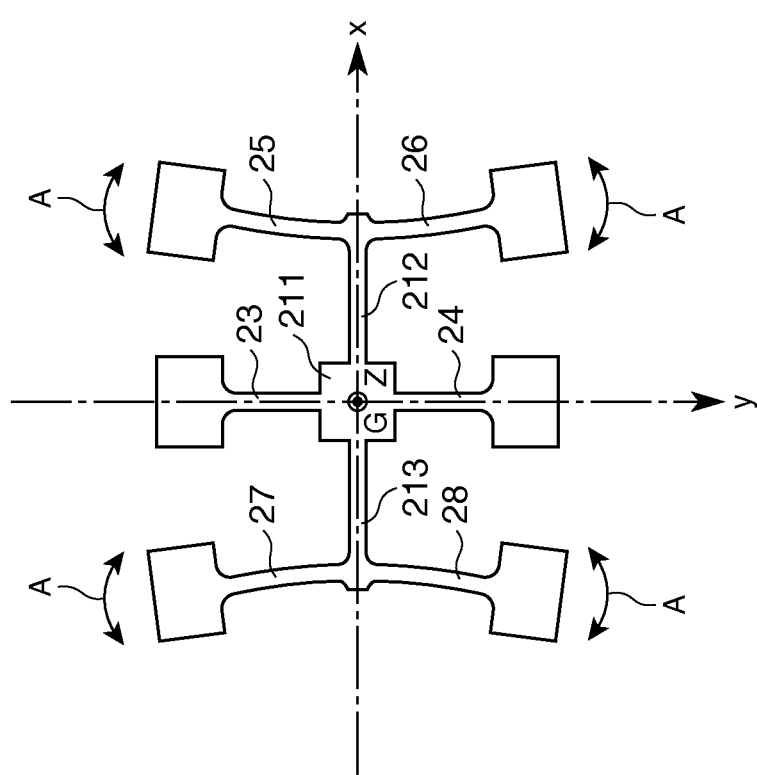

FIG. 1 is a sectional view showing a schematic configuration of the sensor device according to the first embodiment of the invention, FIG. 2 is a plan view of the sensor device shown in FIG. 1, FIG. 3 is a plan view of a sensor element of the sensor device shown in FIG. 1, FIG. 4A is a sectional view along A-A line in FIG. 3, FIG. 4B is a sectional view along B-B line in FIG. 3, FIG. 5 is a partially enlarged plan view for explanation of a drive part of the sensor element shown in FIG. 3, FIG. 6 is a partially enlarged plan view for explanation of a detection part of the sensor element shown in FIG. 3, and FIGS. 7A and 7B are plan views for explanation of driving of the sensor element shown in FIG. 3.

Note that, in FIGS. 1 to 7B, for convenience of explanation, an x-axis, a y-axis, and a z-axis are shown as three axes orthogonal to one another, and the tip end sides of the shown arrows are referred to as "positive sides" and the base end sides are referred to as "negative sides". Further, as below, the direction in parallel to the x-axis is referred to as "x-axis direction", the direction in parallel to the y-axis is referred to as "y-axis direction", the direction in parallel to the z-axis is referred to as "z-axis direction", the +z-axis side (the upside in FIG. 1) is referred to as "up" and the −z-axis side (the downside in FIG. 1) is also referred to as "down".

A sensor device 1 shown in FIGS. 1 and 2 is a gyro sensor that detects an angular velocity. The sensor device 1 has a sensor element (vibrating element) 2, an IC chip 3, and a package 9 housing the sensor element 2 and the IC chip 3. Note that the IC chip 3 may be omitted or provided outside of the package 9.

Sensor Element

The sensor element 2 is an "out-of-plane detection" sensor element (vibrating reed) that detects an angular velocity around the z-axis with respect to the principal surface (xy plane) of the sensor element 2. As shown in FIG. 3, the sensor element 2 includes a vibrator 20 having plural vibrating arms, and plural detection parts 41 to 44, plural drive parts 51 to 58, and plural terminals 61 to 66 provided on the surface of the vibrator 20.

As below, the respective parts forming the sensor element 2 will be sequentially explained in detail.

Vibrating Reed

First, the vibrator 20 will be explained.

As shown in FIG. 3, the vibrator 20 has a structure called a double T-shaped structure.

Specifically, the vibrator 20 has a base part 21, a support part 22 that supports the base part 21, and two detection vibrating arms (second vibrating arms) 23, 24 and four drive vibrating arms (first vibrating arms) 25 to 28 extended from the base part 21.

The base part 21 has a main body part 211, and a pair of connecting arms 212, 213 extending from the main body part 211 in opposite directions along the x-axis direction.

The support part 22 has a pair of fixed parts 221, 222 fixed with respect to the package 9, a pair of beam parts 223, 224 connecting the fixed part 221 and the main body part 211 of the base part 21, and a pair of beam parts 225, 226 connecting the fixed part 222 and the main body part 211 of the base part 21.

The detection vibrating arms 23, 24 extend in opposite directions from the main body part 211 of the base part 21 along the y-axis direction.

In the embodiment, the side surfaces near the boundary parts between the detection vibrating arms 23, 24 and the base part 21 bend in a stepwise fashion (see FIG. 6).

The drive vibrating arms 25, 26 extend in opposite directions from the tip end part of the connecting arm 212 of the base part 21 along the y-axis direction.

The drive vibrating arms 27, 28 extend in opposite directions from the tip end part of the connecting arm 213 of the base part 21 along the y-axis direction.

In the embodiment, the side surfaces near the boundary parts between the drive vibrating arms 25 to 28 and the base part 21 bend in a stepwise fashion (see FIG. 5).

In the embodiment, a spindle part (hammer head) 231 having a larger width than that of the base end part is provided in the tip end part of the detection vibrating arm 23. Similarly, a spindle part 241 is provided in the tip end part of the detection vibrating arm 24, a spindle part 251 is provided in the tip end part of the drive vibrating arm 25, a spindle part 261 is provided in the tip end part of the drive vibrating arm 26, a spindle part 271 is provided in the tip end part of the drive vibrating arm 27, and a spindle part 281 is provided in the tip end part of the drive vibrating arm 28. By providing the spindle parts, detection sensitivity of the sensor element 2 may be improved.

As a constituent material of the vibrator 20, not particularly limited, but any material that may exert desired vibration characteristics of various piezoelectric materials and various non-piezoelectric materials may be used.

For example, as the piezoelectric material forming the vibrator 20, crystal, lithium tantalate, lithium niobate, lithium borate, barium titanate, or the like may be cited. Particularly, crystal (an X-cut plate, an AT-cut plate, a Z-cut plate, or the like) is preferable as the piezoelectric material forming the vibrator 20. When the vibrator 20 is formed using crystal, the vibration characteristics (specifically, frequency-temperature characteristics) of the vibrator 20 may be made advantageous. Further, the vibrator 20 may be formed with higher dimension accuracy by etching.

Further, as the non-piezoelectric material forming the vibrator 20, for example, silicon, quartz, or the like may be cited. Particularly, silicon is preferable as the non-piezoelectric material forming the vibrator 20. When the vibrator 20 is formed using silicon, the vibrator 20 having advantageous vibration characteristics may be realized at lower cost. Further, the vibrator 20 may be formed with higher dimension accuracy by etching using a known microfabrication technology. Accordingly, the vibrator 20 may be downsized.

In the embodiment, an insulator layer 29 is provided on the upper surface of the vibrator 20 (see FIGS. 4A and 4B). Thereby, short circuit between the respective parts of the drive parts 51 to 58 and the detection parts 41 to 44 may be prevented.

The insulator layer 29 includes $SiO_2$ (silicon oxide), AlN (aluminum nitride), SiN (silicon nitride), or the like, for example. Further, the forming method of the insulator layer 29 is not particularly limited, but a known deposition method may be used. For example, when the vibrator 20 is formed using silicon, by thermal oxidation of the upper surface of the vibrator 20, the insulator layer 29 including $SiO_2$ may be formed.

According to the vibrator 20 having the above explained configuration, the detection vibrating arms 23, 24 provided with the detection parts 41 to 44 and the drive vibrating arms 25 to 28 provided with the drive parts 51 to 58 are separately provided, and thus, driving by the drive parts 51 to 58 and detection by the detection parts 41 to 44 may be respectively efficiently performed. Accordingly, the detection sensitivity of the sensor element may be improved.

Further, the vibrator 20 has the structure called the double-T shaped structure as described above, and thus, the drive vibrating arms 25 to 28 are flexurally vibrated in in-plane directions and the flexural vibrations of the detection vibrating arms 23, 24 in the in-plane directions may be excited by the Coriolis force as will be described later.

Drive Parts

Next, the drive parts 51 to 58 will be explained.

As shown in FIG. 3, the drive parts 51, 52 are provided on the drive vibrating arm 25 of the vibrator 20. Further, the drive parts 53, 54 are provided on the drive vibrating arm 26 of the vibrator 20. Furthermore, the drive parts 55, 56 are provided on the drive vibrating arm 27 of the vibrator 20. In addition, the drive parts 57, 58 are provided on the drive vibrating arm 28 of the vibrator 20.

The pair of drive parts 51, 52 flexurally vibrate the drive vibrating arm 25 in the x-axis direction by energization. Similarly, the pair of drive parts 53, 54 flexurally vibrate the drive vibrating arm 26 in the x-axis direction by energization. Further, the pair of drive parts 55, 56 flexurally vibrate the drive vibrating arm 27 in the x-axis direction by energization. In addition, the pair of drive parts 57, 58 flexurally vibrate the drive vibrating arm 28 in the x-axis direction by energization.

More specifically, regarding the pair of drive parts 51, 52, in the width direction (x-axis direction) of the drive vibrating arm 25, the drive part 51 is provided at one side (at the right side in FIG. 3) and the drive part 52 is provided at the other side (at the left side in FIG. 3). Similarly, regarding the pair of drive parts 53, 54, in the width direction (x-axis direction) of the drive vibrating arm 26, the drive part 53 is provided at one side (at the right side in FIG. 3) and the drive part 54 is provided at the other side (at the left side in FIG. 3). Further, regarding the pair of drive parts 55, 56, in the width direction (x-axis direction) of the drive vibrating arm 27, the drive part 55 is provided at one side (at the right side in FIG. 3) and the drive part 56 is provided at the other side (at the left side in FIG. 3). Furthermore, regarding the pair of drive parts 57, 58, in the width direction (x-axis direction) of the drive vibrating arm 28, the drive part 57 is provided at one side (at the right side in FIG. 3) and the drive part 58 is provided at the other side (at the left side in FIG. 3).

In the embodiment, the pair of drive parts 51, 52 respectively extend in the y-axis direction with the end parts at the base part 21 side bending or curving in directions away from each other over the boundary parts between the drive vibrating arm 25 and the base part 21. Similarly, the pair of drive parts 53, 54 respectively extend in the y-axis direction with the end parts at the base part 21 side bending or curving in directions away from each other over the boundary parts between the drive vibrating arm 26 and the base part 21. Further, the pair of drive parts 55, 56 respectively extend in the y-axis direction with the end parts at the base part 21 side bending or curving in directions away from each other over the boundary parts between the drive vibrating arm 27 and the base part 21. Furthermore, the pair of drive parts 57, 58 respectively extend in the y-axis direction with the end parts at the base part 21 side bending or curving in directions away from each other over the boundary parts between the drive vibrating arm 28 and the base part 21. Note that the bending or curving parts of the respective drive parts 51 to 58 will be described later in detail.

These drive parts 51 to 58 are respectively piezoelectric elements adapted to expand and contract mainly in the y-axis direction by energization. The drive parts 51, respectively drive-vibrate (flexurally vibrate in the x-axis direction) the drive vibrating arm 25 by energization. Similarly, the drive parts 53, 54 respectively drive-vibrate (flexurally vibrate in the x-axis direction) the drive vibrating arm 26 by energization. Further, the drive parts 55, 56 respectively drive-vibrate (flexurally vibrate in the x-axis direction) the drive vibrating arm 27 by energization. Furthermore, the drive parts 57, 58 respectively drive-vibrate (flexurally vibrate in the x-axis direction) the drive vibrating arm 28 by energization.

By using the drive parts 51 to 58, even when the drive vibrating arms 25 to 28 themselves have no piezoelectric properties or the drive vibrating arms 25 to 28 themselves have piezoelectric properties, or even when the directions of their polarization axes and crystal axes are not suitable for flexural vibration in the x-axis direction, the respective drive vibrating arms 25 to 28 may be flexurally vibrated (drive-vibrated) in the x-axis direction relatively easily and efficiently. Further, regardless of whether with or without the piezoelectric properties and the directions of the polarization axes and crystal axes of the drive vibrating arms 25 to 28, the range of choice of the constituent material of the respective drive vibrating arms 25 to 28 is wider. Accordingly, the vibrator 20 having desired vibration characteristics may be realized relatively easily.

As below, the configurations of the drive parts 51, 52 will be explained in detail. Note that the configurations of the drive parts 53 to 58 are the same as those of the drive parts 51, 52 (have the same multilayered structures), and their explanation will be omitted.

As shown in FIG. 4A, the drive part 51 is formed by stacking a first electrode layer 511, a piezoelectric layer (piezoelectric thin film) 512, and a second electrode layer 513 on the drive vibrating arm 25 in this order.

Similarly, the drive part 52 is formed by stacking a first electrode layer 521, a piezoelectric layer (piezoelectric thin film) 522, and a second electrode layer 523 on the drive vibrating arm 25 in this order.

The first electrode layers 511 and 521 may be respectively formed using, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) or a transparent electrode material such as ITO or ZnO.

Of them, as the constituent material of the first electrode layers 511 and 521, respectively, it is preferable to use metal with gold as a chief material (gold, gold alloy) or platinum and more preferable to use metal with gold as a chief material (especially, gold).

Au has advantageous conductivity (smaller electrical resistance) and advantageous resistance to oxidation, and is preferable as an electrode material. Further, Au is patterned by etching more easily than Pt. Furthermore, by forming the first electrode layers 511 and 521 using gold or gold alloy, orientation of the piezoelectric layers 512, 522 may be improved.

In addition, the average thicknesses of the first electrode layers 511 and 521 are respectively not particularly limited, however, for example, preferably from about 1 to 300 nm and more preferably from about 10 to 200 nm. Thereby, the conductivity of the above described first electrode layers 511 and 521 may be made advantageous while the first electrode layers 511 and 521 may be prevented from adversely affecting the drive characteristics of the drive parts 51, 52 and the vibration characteristics of the drive vibrating arm 25.

Note that a foundation layer having a function of preventing the first electrode layers 511 and 521 from separating from the drive vibrating arm 25 may be provided between the first electrode layers 511 and 521 and the drive vibrating arm 25.

The foundation layer may include Ti, Cr, or the like, for example.

As the constituent material of the piezoelectric layers 512, 522 (piezoelectric material), respectively, for example, zinc oxide (ZnO), aluminum nitride (AlN), lithium tantalate (LiTaO$_3$), lithium niobate (LiNbO$_3$), potassium niobate (KNbO$_3$), lithium tetraborate (Li$_2$B$_4$O$_7$), barium titanate (BaTiO$_3$), PZT (lead zirconate titanate), or the like may be cited.

Of them, as the constituent material of the piezoelectric layers 512, 522, respectively, PZT is preferably used. PZT has advantageous c-axis orientation. Accordingly, by forming the piezoelectric layers 512, 522 using PZT as a chief material, the CI value of the sensor element 2 may be reduced. Further, these materials may be deposited by reactive sputtering.

In addition, the average thicknesses of the piezoelectric layers 512, 522 are preferably from 1000 to 5000 nm and more preferably from 2000 to 4000 nm. Thereby, the drive characteristics of the drive parts 51, 52 may be made advantageous while the piezoelectric layers 512, 522 may be prevented from adversely affecting the vibration characteristics of the drive vibrating arm 25.

The second electrode layers 513, 523 may be respectively formed using, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) or a transparent electrode material such as ITO or ZnO.

Further, the average thicknesses of the second electrode layers 513, 523 are respectively not particularly limited, however, for example, preferably from about 1 to 300 nm and more preferably from about 10 to 200 nm. Thereby, the conductivity of the second electrode layers 513, 523 may be made advantageous while the second electrode layers 513, 523 may be prevented from adversely affecting the drive characteristics of the drive parts 51, 52 and the vibration characteristics of the drive vibrating arm 25.

Note that an insulator layer (insulating protective layer) having a function of protecting the piezoelectric layer 512 and preventing short circuit between the first electrode layer 511 and the second electrode layer 513 may be provided between the piezoelectric layer 512 and the second electrode layer 513. Similarly, an insulator layer may be provided between the piezoelectric layer 522 and the second electrode layer 523.

The insulator layer may include $SiO_2$ (silicon oxide), AlN (aluminum nitride), SiN (silicon nitride), or the like, for example.

Further, a foundation layer having a function of preventing the second electrode layer 513 from separating from the piezoelectric layer 512 (the insulator layer when the above described insulator layer is provided) may be provided between the piezoelectric layer 512 and the second electrode layer 513. Similarly, a foundation layer may be provided between the piezoelectric layer 522 and the second electrode layer 523.

The foundation layer may include Ti, Cr, or the like, for example.

Here, the end parts of the drive parts 51, 52 at the base part 21 side will be described in detail. Note that the end parts of the drive parts 53 to 58 at the base part 21 side are the same as the end parts of the drive parts 51, 52 at the base part 21 side.

As shown in FIG. 5, the drive part 51 has a part 514 provided over the boundary part between the drive vibrating arm 25 and the base part 21. Similarly, the drive part 52 has a part 524 provided over the boundary part between the drive vibrating arm 25 and the base part 21.

Further, the parts 514, 524 bend or curve to extend in the direction including the direction component (x-axis direction component) orthogonal to the extension direction (y-axis direction) of the drive vibrating arm 25 along the side surfaces of the drive vibrating arm 25 and the base part 21.

Here, the part 514 of the drive part 51 bends or curves toward the opposite side to the drive part 52. Similarly, the part 524 of the drive part 52 bends or curves toward the opposite side to the drive part 51. That is, the parts 514, 524 of the drive parts 51, 52 bend or curve in directions away from each other.

In the drive parts 51, 52 having the bending and curving parts 514, 524, the parts 514, 524 expand or contract mainly in the x-axis direction, and thereby, the drive force efficiently acts to generate stress in the parts near the boundary parts between the drive vibrating arm 25 and the base part 21 in the direction in which the drive vibrating arm 25 is bent in the x-axis direction. Accordingly, in cooperation with the drive force due to expansion or contraction of the other parts than the parts 514, 524 of the drive parts 51, 52 in the y-axis direction, the drive vibrating arm 25 may be efficiently flexurally vibrated. As a result, the detection sensitivity of the sensor element 2 may be improved.

Further, the ends of the drive parts 51, 52 at the base part 21 side are located at the outer side of the drive vibrating arm 25 than virtual surfaces formed by extending the side surfaces of the drive vibrating arm 25 along the extension direction of the drive vibrating arm 25. Thereby, the drive force of the drive parts 51, 52 may be efficiently transmitted to the drive vibrating arm 25.

Furthermore, regarding the drive parts 51, 52, given that the width of the drive vibrating arm 25 is Wd and the respective distances between the side surfaces (the virtual surfaces) of the drive vibrating arm 25 in the width direction (x-axis direction) of the drive vibrating arm 25 and the ends of the drive parts 51, 52 at the base part 21 side are Ld, Ld/Wd is preferably equal to or less than 1.2, more preferably from 0.5 to 0.9, and even more preferably from 0.65 to 0.75.

Thereby, the drive parts 51, 52 may efficiently flexurally vibrate the drive vibrating arm 25.

In this regard, if Ld/Wd is less than the lower limit value, depending on the shape near the boundary parts between the drive vibrating arm 25 and the base part 21, the configurations of the drive parts 51, 52, or the like, it is difficult that the drive force of the above described parts 514, 524 efficiently acts on the parts near the boundary parts between the drive vibrating arm 25 and the base part 21. On the other hand, if Ld/Wd exceeds the upper limit value, the parts that do not contribute to the flexural vibration of the drive vibrating arm 25 of the end parts of the parts 514, 524 become larger, and degradation of oscillation stability of the drive vibrating arm 25 is caused.

Further, the drive parts 51, 52 are respectively provided so that the distances between the side surfaces of the drive vibrating arm 25 and the base part 21 and themselves may be constant. Thereby, the drive vibrating arm 25 may be efficiently flexurally vibrated.

The distances between the drive parts 51, 52 and the side surfaces of the drive vibrating arm 25 and the base part 21 are not particularly limited, however, it is preferable that the distances are as short as possible in view of efficient use of the drive force of the drive parts 51, 52 for flexural vibration of the drive vibrating arm 25.

In the drive part 51 having the above described configuration, when a voltage is applied between the first electrode layer 511 and the second electrode layer 513, an electric field in the z-axis direction is generated in the piezoelectric layer 512, the other parts than the part 514 of the piezoelectric layer 512 expand or contract in the y-axis direction, and the part 514 expands or contracts in the x-axis direction. Similarly, in the drive part 52, when a voltage is applied between the first electrode layer 521 and the second electrode layer 523, an electric field in the z-axis direction is generated in the piezoelectric layer 522, the other parts than the part 524 of the piezoelectric layer 522 expand or contract in the y-axis direction, and the part 524 expands or contracts in the x-axis direction.

In this regard, when one drive part of the drive parts 51, 52 is expanded in the y-axis direction, the other drive part is contracted in the y-axis direction, and thereby, the drive vibrating arm 25 may be flexurally vibrated in the x-axis direction.

Similarly, the drive vibrating arm 26 may be flexurally vibrated in the x-axis direction by the drive parts 53, 54. Further, the drive vibrating arm 27 may be flexurally vibrated in the x-axis direction by the drive parts 55, 56. Furthermore, the drive vibrating arm 28 may be flexurally vibrated in the x-axis direction by the drive parts 57, 58.

Regarding the drive part 51, the first electrode layer 511 is electrically connected to the terminal 61 via wiring (not shown), and the second electrode layer 513 is electrically connected to the terminal 64 via wiring (not shown).

Further, regarding the drive part 52, the first electrode layer 521 is electrically connected to the terminal 64 via wiring (not shown), and the second electrode layer 523 is electrically connected to the terminal 61 via wiring (not shown).

Similarly, regarding the drive part 53, the first electrode layer is electrically connected to the terminal 61 and the second electrode layer is electrically connected to the terminal 64, and further, regarding the drive part 54, the first electrode layer is electrically connected to the terminal 64 and the second electrode layer is electrically connected to the terminal 61.

Furthermore, regarding the drive part 55, the first electrode layer is electrically connected to the terminal 64 and the second electrode layer is electrically connected to the terminal 61, and further, regarding the drive part 56, the first electrode layer is electrically connected to the terminal 61 and the second electrode layer is electrically connected to the terminal 64.

In addition, regarding the drive part 57, the first electrode layer is electrically connected to the terminal 64 and the second electrode layer is electrically connected to the terminal 61, and further, regarding the drive part 58, the first electrode layer is electrically connected to the terminal 61 and the second electrode layer is electrically connected to the terminal 64.

Detection Parts

Next, the detection parts 41 to 44 will be explained.

The detection parts 41, 42 (first detection part and second detection part) are respectively provided on the detection vibrating arm 23 of the above described vibrator 20. Further, the detection parts 43, 44 (first detection part and second detection part) are respectively provided on the detection vibrating arm 24 of the above described vibrator 20.

The pair of detection parts 41, 42 detect the flexural vibration (so-called in-plane vibration) of the detection vibrating arm 23 in the x-axis direction. Similarly, the pair of detection parts 43, 44 detect the flexural vibration of the detection vibrating arm 24 in the x-axis direction.

More specifically, regarding the pair of detection parts 41, 42, the detection part 41 (first detection part) is provided at one side (at the right side in FIG. 3) in the width direction (x-axis direction) of the detection vibrating arm 23, and the detection part 42 (second detection part) is provided at the other side (at the left side in FIG. 3). Similarly, regarding the pair of detection parts 43, 44, the detection part 43 (first detection part) is provided at one side (at the right side in FIG. 3) in the width direction (x-axis direction) of the detection vibrating arm 24, and the detection part 44 (second detection part) is provided at the other side (at the left side in FIG. 3).

In the embodiment, the pair of detection parts 41, 42 respectively extend in the y-axis direction, and the end parts at the base part 21 side bend or curve over the boundary parts between the detection vibrating arm 23 and the base part 21 in directions away from each other. Similarly, the pair of detection parts 43, 44 respectively extend in the y-axis direction, and the end parts at the base part 21 side bend or curve over the boundary parts between the detection vibrating arm 24 and the base part 21 in directions away from each other. Note that the bending or curving parts of the respective detection parts 41 to 44 will be described later in detail.

The respective detection parts 41 to 44 are piezoelectric elements adapted to expand and contract in the y-axis direction and output electric charge. The detection parts 41, 42 respectively output electric charge with the vibration (flexural vibration in the x-axis direction) of the detection vibrating arm 23. Similarly, the detection parts 43, 44 respectively output electric charge with the vibration (flexural vibration in the x-axis direction) of the detection vibrating arm 24.

By using the detection parts 41 to 44, even when the detection vibrating arms 23, 24 themselves have no piezoelectric properties, or even when the detection vibrating arms 23, 24 themselves have piezoelectric properties, but the directions of their polarization axes and crystal axes are not suitable for detection of the flexural vibration in the x-axis direction, the flexural vibrations of the respective detection vibrating arms 23, 24 in the x-axis direction may be detected relatively easily and efficiently. Further, regardless of whether with or without the piezoelectric properties and the directions of the polarization axes and crystal axes of the detection vibrating arms 23, 24, the range of choice of the constituent material of the respective detection vibrating arms 23, 24 is wider. Accordingly, the vibrator 20 having desired vibration characteristics may be realized relatively easily.

The detection parts 41 to 44, 51 to 58 are respectively piezoelectric elements having multilayered structures in which plural layers are stacked in the z-axis direction.

As below, the configurations of the detection parts 41, 42 will be explained in detail. Note that the configurations of the detection parts 43, 44 are the same as those of the detection parts 41, 42 (having the same multilayered structures), and their explanation will be omitted.

As shown in FIG. 4B, the detection part 41 (first detection part) has a first electrode layer 411 (first lower electrode layer), a second electrode layer 413 (first upper electrode layer) provided at the opposite side to the detection vibrating arm 23 with respect to the first electrode layer 411, and a piezoelectric layer 412 (first piezoelectric layer) provided between the first electrode layer 411 and the second electrode layer 413. In other words, in the detection part 41, the first electrode layer 411, the piezoelectric layer (piezoelectric thin layer) 412, and the second electrode layer 413 are stacked on the detection vibrating arm 23 in this order.

Similarly, in the detection part 42 (second detection part), a first electrode layer 421 (second lower electrode layer), a piezoelectric layer (piezoelectric thin layer) 422 (second piezoelectric layer), and a second electrode layer 423 (second upper electrode layer) are stacked on the detection vibrating arm 23 in this order.

The first electrode layers 411, 421 may be respectively formed using, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) or a transparent electrode material such as ITO or ZnO.

Of them, as the constituent material of the first electrode layers 411, 421, respectively, it is preferable to use metal with gold as a chief material (gold, gold alloy) or platinum and more preferable to use metal with gold as a chief material (especially, gold).

Au has advantageous conductivity (smaller electrical resistance) and advantageous resistance to oxidation, and is preferable as an electrode material. Further, Au is patterned by etching more easily than Pt. Furthermore, by forming the first electrode layers 411 and 421 using gold or gold alloy, orientation of the piezoelectric layers 412, 422 may be improved.

In addition, the average thicknesses of the first electrode layers 411 and 421 are respectively not particularly limited, however, for example, preferably from about 1 to 300 nm and more preferably from about 10 to 200 nm. Thereby, the conductivity of the above described first electrode layers 411 and 421 may be made advantageous while the first electrode layers 411 and 421 may be prevented from adversely affecting the detection characteristics of the detection parts 41, 42 and the vibration characteristics of the detection vibrating arm 23.

Note that a foundation layer having a function of preventing the first electrode layers 411 and 421 from separating from the detection vibrating arm 23 may be provided between the first electrode layers 411 and 421 and the detection vibrating arm 23.

The foundation layer may include Ti, Cr, or the like, for example.

As the constituent material of the piezoelectric layers 412, 422 (piezoelectric material), respectively, for example, zinc oxide (ZnO), aluminum nitride (AlN), lithium tantalate ($LiTaO_3$), lithium niobate ($LiNbO_3$), potassium niobate ($KNbO_3$), lithium tetraborate ($Li_2B_4O_7$), barium titanate ($BaTiO_3$), PZT (lead zirconate titanate), or the like may be cited.

Of them, as the constituent material of the piezoelectric layers 412, 422, respectively, PZT is preferably used. PZT has advantageous c-axis orientation. Accordingly, by forming the piezoelectric layers 412, 422 using PZT as a chief material, the CI value of the sensor element 2 may be reduced. Further, these materials may be deposited by reactive sputtering.

In addition, the average thicknesses of the piezoelectric layers 412, 422 are preferably from 50 to 3000 nm and more preferably from 200 to 2000 nm. Thereby, the detection characteristics of the detection parts 41, 42 may be made advantageous while the piezoelectric layers 412, 422 may be prevented from adversely affecting the vibration characteristics of the detection vibrating arm 23.

The second electrode layers 413, 423 may be respectively formed using, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) or a transparent electrode material such as ITO or ZnO.

Further, the average thicknesses of the second electrode layers 413, 423 are respectively not particularly limited, however, for example, preferably from about 1 to 300 nm and more preferably from about 10 to 200 nm. Thereby, the conductivity of the second electrode layers 413, 423 may be made advantageous while the second electrode layers 413, 423 may be prevented from adversely affecting the detection characteristics of the detection parts 41, 42 and the vibration characteristics of the detection vibrating arm 23.

Note that an insulator layer (insulating protective layer) having a function of protecting the piezoelectric layer 412 and preventing short circuit between the first electrode layer 411 and the second electrode layer 413 may be provided between the piezoelectric layer 412 and the second electrode layer 413. Similarly, an insulator layer may be provided between the piezoelectric layer 422 and the second electrode layer 423.

The insulator layer may include $SiO_2$ (silicon oxide) AlN (aluminum nitride), SiN (silicon nitride), or the like, for example.

Further, a foundation layer having a function of preventing the second electrode layer 413 from separating from the piezoelectric layer 412 (the insulator layer when the above described insulator layer is provided) may be provided between the piezoelectric layer 412 and the second electrode layer 413. Similarly, a foundation layer may be provided between the piezoelectric layer 422 and the second electrode layer 423.

The foundation layer may include Ti, Cr, or the like, for example.

Here, the end parts of the detection parts 41, 42 at the base part 21 side will be described in detail. Note that the end parts of the detection parts 43, 44 at the base part 21 side are the same as the end parts of the detection parts 41, 42 at the base part 21 side.

As shown in FIG. 6, the detection part 41 has a part 414 provided over the boundary part between the detection vibrating arm 23 (vibrating arm) and the base part 21. Similarly, the detection part 42 has a part 424 provided over the boundary part between the detection vibrating arm 23 (vibrating arm) and the base part 21.

Further, the parts 414, 424 bend or curve to extend in the direction including the direction component (x-axis direction component) orthogonal to the extension direction (y-axis direction) of the detection vibrating arm 23 along the side surfaces of the detection vibrating arm 23 and the base part 21.

Here, the part 414 of the detection part 41 bends or curves toward the opposite side to the detection part 42. Similarly, the part 424 of the detection part 42 bends or curves toward the opposite side to the detection part 41. That is, the parts 414, 424 of the detection parts 41, 42 bend or curve in directions away from each other.

The detection parts 41, 42 having the bending and curving parts 414, 424 may not only output electric charge with the stress of the detection vibrating arm 23 itself by the flexural vibration of the detection vibrating arm 23 but also output electric charge with the stress of the base part 21 by the flexural vibration of the detection vibrating arm 23. Accordingly, the detection sensitivity of the sensor element 2 may be improved.

More specifically, when the detection vibrating arm 23 flexurally vibrates (in-plane-vibrates), the stress is the largest in the end part of the detection vibrating arm 23 at the base part 21 side. Further, concurrently, with the flexural vibration of the detection vibrating arm 23, stress is also generated in the part of the base part 21 near the boundary parts between the detection vibrating arm 23 and itself. In this regard, in the part of the base part 21 near the boundary parts between the detection vibrating arm 23 and itself, the stress in the direction along the side surfaces is generated.

Accordingly, the above described bending and curving parts 414, 424 expand or contract mainly in the x-axis direction with the stress of the above described base part 21. Thereby, the detection parts 41, 42 may output electric charge with the stress of the base part 21. In this regard, the parts 414, 424 extend along the direction of the stress of the base part 21, and thus, the electric charge may be efficiently output with the stress of the base part 21.

As described above, the detection parts 41, 42 may output the larger amount of electric charge with the flexural vibration of the detection vibrating arm 23. As a result, the detection sensitivity of the sensor element 2 may be improved.

Further, the ends of the detection parts 41, 42 at the base part 21 side are located at the outer side of the detection vibrating arm 23 than virtual surfaces formed by extending the side surfaces of the detection vibrating arm 23 along the extension direction of the detection vibrating arm 23. Thereby, the detection parts 41, 42 may output electric charge with the stress of the base part 21 by the flexural vibration of the detection vibrating arm 23.

Furthermore, regarding the detection parts 41, 42, given that the width of the detection vibrating arm 23 is Ws and the respective distances between the side surfaces (virtual surfaces) of the detection vibrating arm 23 in the width direction (x-axis direction) of the detection vibrating arm 23 and the ends of the detection parts 41, 42 at the base part 21 side are Ls, Ls/Ws is preferably equal to or less than 1.2, more preferably from 0.5 to 0.9, and even more preferably from 0.65 to 0.75.

Thereby, the detection parts 41, 42 may efficiently output electric charge with the stress of the base part 21 by flexural vibration of the detection vibrating arm 23.

In this regard, if Ls/Ws is less than the lower limit value, depending on the shape near the boundary parts between the detection vibrating arm 23 and the base part 21, the configurations of the detection parts 41, 42, or the like, it is difficult that the above described parts 414, 424 efficiently output the electric charge due to the stress in the parts near the boundary parts between the detection vibrating arm 23 and the base part 21. On the other hand, if Ls/Ws exceeds the upper limit value, the parts that do not contribute to the detection of the flexural vibration of the detection vibrating arm 23 of the end parts of the parts 414, 424 become larger, and the parasitic capacity in the detection parts 41, 42 is increased.

Further, the detection parts 41, 42 are provided so that the distances G1 between the side surfaces of the detection vibrating arm 23 and the base part 21 and themselves may be constant. Thereby, the detection parts 41, 42 may respectively efficiently output electric charge with the stress of the detection vibrating arm 23 itself by the flexural vibration of the detection vibrating arm 23 and the stress of the base part 21 by the flexural vibration of the detection vibrating arm 23.

The distances G1 between the detection parts 41, 42 and the side surfaces of the detection vibrating arm 23 and the base part 21 are not particularly limited, however, it is preferable that the distances are as short as possible in view of efficient detection of flexural vibration of the detection vibrating arm 23.

Regarding the detection parts 41, 42 having the above described configurations, when the detection vibrating arm 23 flexurally vibrates in the x-axis direction, one detection part expands and the other detection part contracts, and electric charge is output. Concurrently, the other parts than the parts 414, 424 of the detection parts 41, 42 expand or contract mainly in the y-axis direction, and the parts 414, 424 expand or contract mainly in the x-axis direction.

Similarly, regarding the detection parts 43, 44, when the detection vibrating arm 24 flexurally vibrates in the x-axis direction, one detection part expands and the other detection part contracts, and electric charge is output.

In the detection parts 41, 42, the second electrode layer 413 of the detection part 41 and the first electrode layer 421 of the detection part 42 are respectively electrically connected to the terminal 62 (first detection terminal), and further, the first electrode layer 411 of the detection part 41 and the second electrode layer 423 of the detection part 42 are respectively electrically connected to the terminal 63 (second detection terminal).

Similarly, the second electrode layer of the detection part 43 and the first electrode layer of the detection part 44 are respectively electrically connected to the terminal 65 (first detection terminal), and further, the first electrode layer of the detection part 43 and the second electrode layer of the detection part 44 are respectively electrically connected to the terminal 66 (second detection terminal).

Terminals

The terminals 61 to 63 are provided on the fixed part 221 of the above described support part 22, and the terminals 64 to 66 are provided on the fixed part 222 of the support part 22.

Further, the terminals 61 to 66, wiring (not shown), etc. may be formed using, for example, a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr) or a transparent electrode material such as ITO or ZnO. Furthermore, they may be collectively and simultaneously formed with the first electrode layers or the second electrode layers of the detection parts 41 to 44 and the drive parts 51 to 58.

The sensor element 2 having the above described configuration detects an angular velocity ω around the z-axis in the following manner.

First, a voltage (drive signal) is applied between the terminal 61 and the terminal 64, and thereby, as shown in FIG. 7A, the drive vibrating arm 25 and the drive vibrating arm 27 are flexurally vibrated (drive-vibrated) close to and away from each other in the directions shown by arrows A in the drawing and the drive vibrating arm 26 and the drive vibrating arm 28 are flexurally vibrated (drive-vibrated) close to and away from each other in the same directions as those of the flexural vibrations.

In this regard, when no angular velocity is applied to the sensor element 2, the base part 21 (the main body part 211 and the connecting arms 212, 213) and the detection vibrating arms 23, 24 hardly vibrate because the drive vibrating arms 25, 26 and the drive vibrating arms 27, 28 perform vibrations plane-symmetrical with respect to the yz plane passing through the center point (center of gravity G).

Under the condition that the drive vibrating arms 25 to 28 drive-vibrate, when the angular velocity ω around the normal line passing through the center of gravity G is applied to the sensor element 2, Coriolis force respectively acts on the drive vibrating arms 25 to 28. Thereby, as shown in FIG. 7B, the connecting arms 212, 213 flexurally vibrate in the directions shown by arrows B in the drawing and, with the vibrations, to cancel out the flexural vibrations, flexural vibrations (detection vibrations) of the detection vibrating arms 23, 24 in the directions shown by arrows C in the drawing are excited.

Then, the electric charge generated in the detection parts 41, 42 by the flexural vibration of the detection vibrating arm 23 is output from the terminals 62, 63. Further, the electric charge generated in the detection parts 43, 44 by the flexural vibration of the detection vibrating arm 24 is output from the terminals 65, 66.

In this manner, the angular velocity ω applied to the sensor element 2 may be obtained based on the electric charge output from the terminals 62, 63, 65, 66.

IC Chip 3

The IC chip 3 shown in FIGS. 1 and 2 is an electronic component having a function of driving the above described sensor element 2 and a function of detecting the output (sensor output) from the sensor element 2.

The IC chip 3 includes a driver circuit (not shown) that drives the sensor element 2 and a detector circuit (not shown) that detects the output (electric charge) from the sensor element 2 (more specifically, the detection parts 41 to 44).

Further, plural connection terminals 31 are provided in the IC chip 3.

Package

The package 9 houses the sensor element 2 and the IC chip 3.

The package 9 includes a base 91 having a recess part opening upward and a lid 92 (lid member) joined to the base 91 to cover the opening of the recess part of the base 91. The package 9 has a housing space S inside and the sensor element 2 and the IC chip 3 are air-tightly housed and placed within the housing space S.

Further, plural internal terminals 71 and plural internal terminals 72 are provided on the upper surface of the base 91.

To the plural internal terminals 71, the terminals 61 to 66 of the sensor element 2 are electrically connected via a conducting fixing member 81 such as solder, silver paste, or a conducting adhesive agent (an adhesive agent in which conducting filler of metal particles or the like is dispersed in a resin material). Further, the sensor element 2 is fixed with respect to the base 91 by the conducting fixing member 81.

The plural internal terminals 71 are electrically connected to the plural internal terminals 72 via wiring (not shown).

The plural connection terminals 31 of the above described IC chip 3 are electrically connected to the plural internal terminals 72 via wiring including bonding wires, for example.

Further, the above described IC chip 3 is bonded to the upper surface of the base 91 using a bonding member 82 such as an adhesive agent including an epoxy resin, acrylic resin, or the like, for example. Thereby, the IC chip 3 is supported and fixed with respect to the base 91.

Furthermore, though not illustrated, plural external terminals used when the sensor device 1 is mounted on an apparatus (external apparatus) in which the device is incorporated are provided on the lower surface of the base 91 (the bottom surface of the package 9).

The plural external terminals are electrically connected to the above described internal terminals 72 via internal wiring (not shown).

The respective internal terminals 71, 72 etc. are metal coatings formed by stacking coatings of nickel (Ni), gold (Au), or the like on metalization layers of tungsten (W) or the like, for example.

The lid 92 is air-tightly bonded to the base 91. Thereby, the package 9 is air-tightly sealed.

The lid 92 is formed using the same material as that of the base 91 or metal such as kovar, 42 Alloy, or stainless steel, for example.

As the bonding method of the base 91 and the lid 92, not particularly limited, but, for example, a bonding method using an adhesive agent including a brazing filler metal, a hardening resin, or the like, a welding method such as seam welding or laser welding may be used.

The bonding is performed under reduced pressure or an inert gas atmosphere, and thereby, the package 9 may be held in the reduced pressure state or the inert gas sealed state.

According to the above described sensor device 1 of the first embodiment, the detection parts 41 to 44 may not only output electric charge with the stress of the detection vibrating arms 23, 24 themselves by the flexural vibrations of the detection vibrating arms 23, 24 but also output electric charge with the stress of the base part 21 by the flexural vibrations of the detection vibrating arms 23, 24. Accordingly, the detection sensitivity of the sensor element 2 may be improved.

Further, the sensor device 1 including the sensor element 2 has advantageous reliability.

Second Embodiment

Next, the second embodiment of the invention will be explained.

Figure 8:
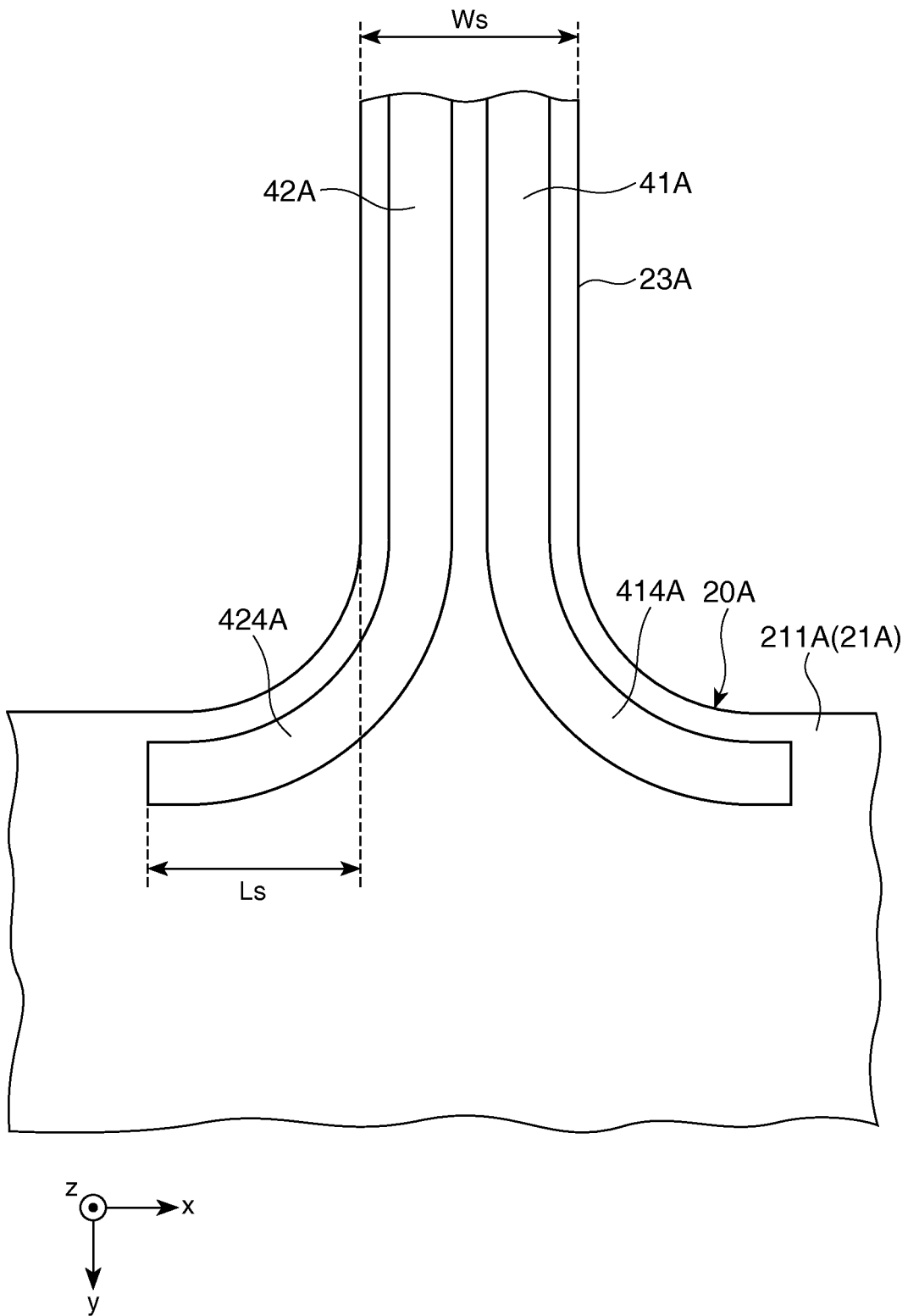
FIG. 8 is a partially enlarged plan view for explanation of a detection part of a sensor element according to a second embodiment of the invention.

FIG. 8 is a partially enlarged plan view for explanation of a detection part of a sensor element according to the second embodiment of the invention.

As below, regarding the sensor element of the second embodiment, the difference from that of the above described embodiment will be centered for explanation and the explanation of the same items will be omitted.

The sensor element according to the second embodiment of the invention is the same as that of the above described first embodiment except that the shapes of the boundary parts between the detection vibrating arms and the base part and the shapes of the detection parts are different. Note that, in FIG. 8, for convenience of explanation, one detection vibrating arm is representatively shown, however, the sensor element of the embodiment has the other detection vibrating arm paired with the one detection vibrating arm and four drive vibrating arms like the sensor element of the above described first embodiment.

The sensor element of the embodiment includes a vibrator 20A having a base part 21A and a detection vibrating arm 23A as shown in FIG. 8, and detection parts 41A, 42A provided on the detection vibrating arm 23A.

The detection vibrating arm 23A extends from a main body part 211A of the base part 21A.

In the embodiment, the side surfaces near the boundary parts between the detection vibrating arm 23A and the base part 21A continuously curve.

The detection part 41A has a part 414A provided over the boundary part between the detection vibrating arm 23A (vibrating arm) and the base part 21A. Similarly, the detection part 42A has a part 424A provided over th boundary part between the detection vibrating arm 23A (vibrating arm) and the base part 21A.

Further, the parts 414A, 424A curve to extend in the direction including the direction component (x-axis direction component) orthogonal to the extension direction (y-axis direction) of the detection vibrating arm 23A along the side surfaces of the detection vibrating arm 23A and the base part 21A.

According to the sensor element of the second embodiment having the above described configuration, advantageous detection sensitivity may be exerted.

Third Embodiment

Next, the third embodiment of the invention will be explained.

Figure 9:
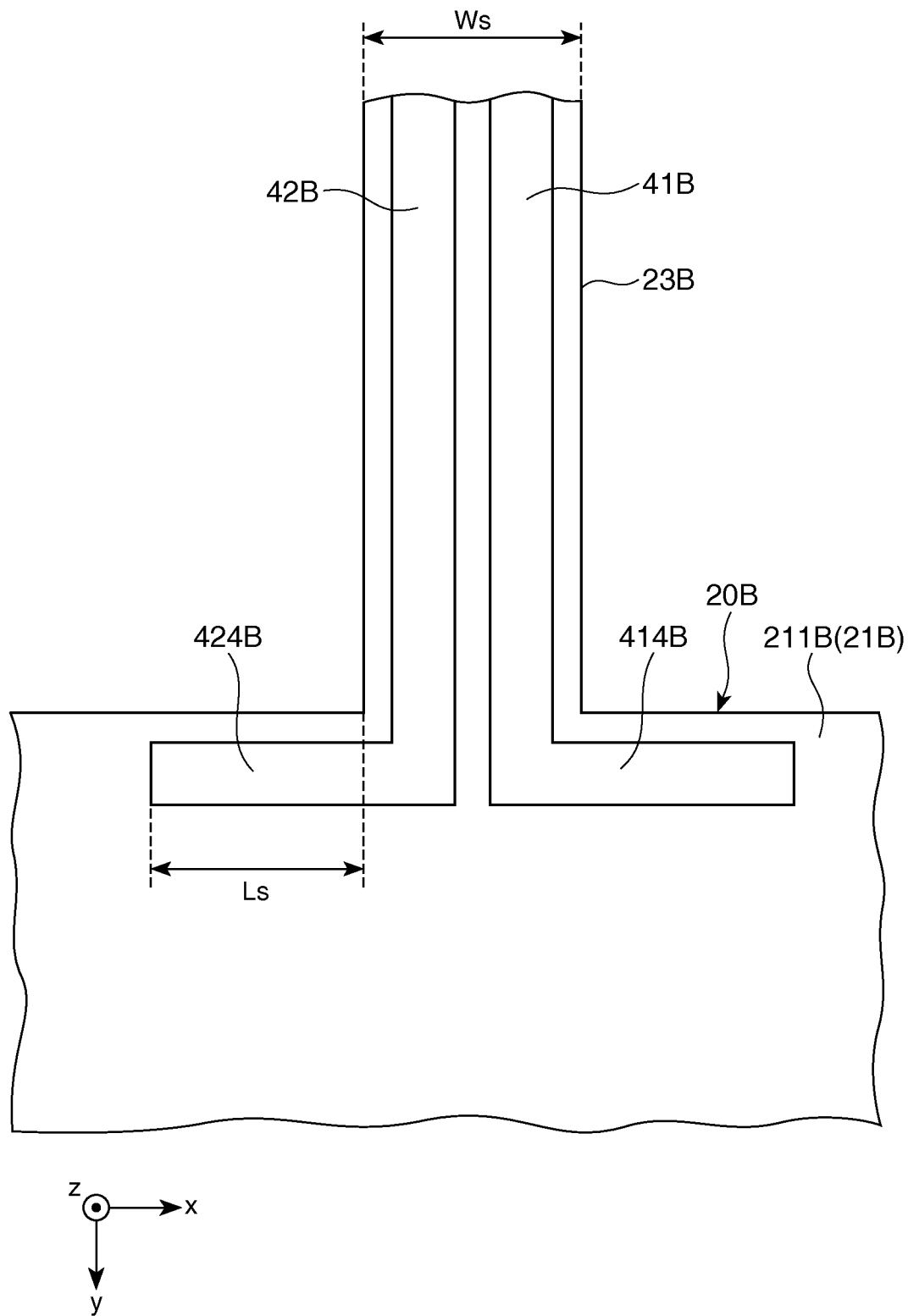
FIG. 9 is a partially enlarged plan view for explanation of a detection part of a sensor element according to a third embodiment of the invention.

FIG. 9 is a partially enlarged plan view for explanation of a detection part of a sensor element according to the third embodiment of the invention.

As below, regarding the sensor element of the third embodiment, the difference from those of the above described embodiments will be centered for explanation and the explanation of the same items will be omitted.

The sensor element according to the third embodiment of the invention is the same as that of the above described first embodiment except that the shapes of the boundary parts between the detection vibrating arms and the base part and the shapes of the detection parts are different. Note that, in FIG. 9, for convenience of explanation, one detection vibrating arm is representatively shown, however, the sensor element of the embodiment has the other detection vibrating arm paired with the one detection vibrating arm and four drive vibrating arms like the sensor element of the above described first embodiment.

The sensor element of the embodiment includes a vibrator 20B having a base part 21B and a detection vibrating arm 23B as shown in FIG. 9, and detection parts 41B, 42B provided on the detection vibrating arm 23B.

The detection vibrating arm 23B extends from a main body part 211B of the base part 21B.

In the embodiment, the side surfaces near the boundary parts between the detection vibrating arm 23B and the base part 21B bend in L shapes.

The detection part 41B has a part 414B provided over the boundary part between the detection vibrating arm 23B (vibrating arm) and the base part 21B. Similarly, the detection part 42B has a part 424B provided over the boundary part between the detection vibrating arm 23B (vibrating arm) and the base part 21B.

Further, the parts 414B, 424B bend to extend in the direction including the direction component (x-axis direction component) orthogonal to the extension direction (y-axis direction) of the detection vibrating arm 23B along the side surfaces of the detection vibrating arm 23B and the base part 21B.

According to the sensor element of the third embodiment having the above described configuration, advantageous detection sensitivity may be exerted.

Electronic Apparatus

By incorporating the above described sensor devices into various electronic apparatuses, electronic apparatuses having advantageous reliability may be provided.

As below, examples of an electronic apparatus including the electronic device according to the invention will be explained in detail with reference to FIGS. 10 to 12.

Figure 10:
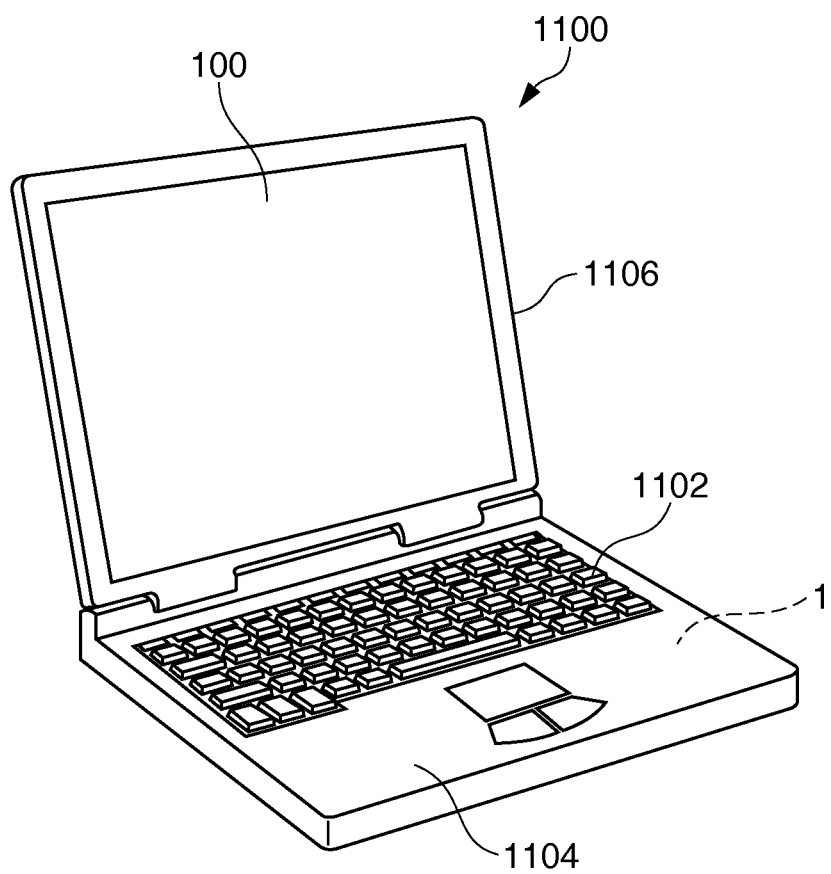
FIG. 10 is a perspective view showing a configuration of a mobile (or notebook) personal computer to which an electronic apparatus of the invention is applied.

FIG. 10 is a perspective view showing a configuration of a mobile (or notebook) personal computer to which the electronic apparatus according to the invention is applied.

In the drawing, a personal computer 1100 includes a main body unit 1104 having a keyboard 1102 and a display unit 1106 having a display part 100, and the display unit 1106 is rotatably supported via a hinge structure part with respect to the main body unit 1104.

The personal computer 1100 contains the above described sensor device 1 that functions as a gyro sensor.

Figure 11:
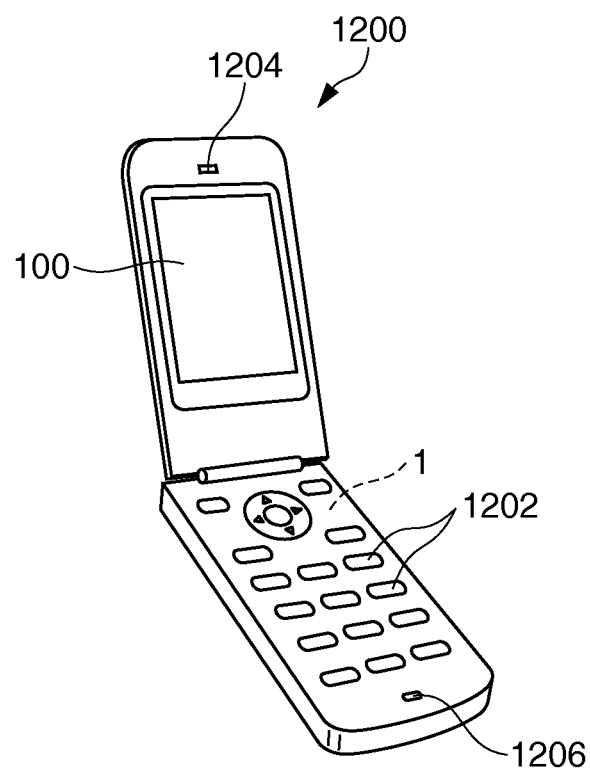
FIG. 11 is a perspective view showing a configuration of a cellular phone (including a PHS) to which the electronic apparatus of the invention is applied.

FIG. 11 is a perspective view showing a configuration of a cellular phone (including a PHS) to which the electronic apparatus according to the invention is applied.

In the drawing, a cellular phone 1200 includes plural operation buttons 1202, an ear piece 1204, and a mouthpiece 1206, and a display part 100 is provided between the operation buttons 1202 and the ear piece 1204.

The cellular phone 1200 contains the above described sensor device 1 that functions as a gyro sensor.

Figure 12:
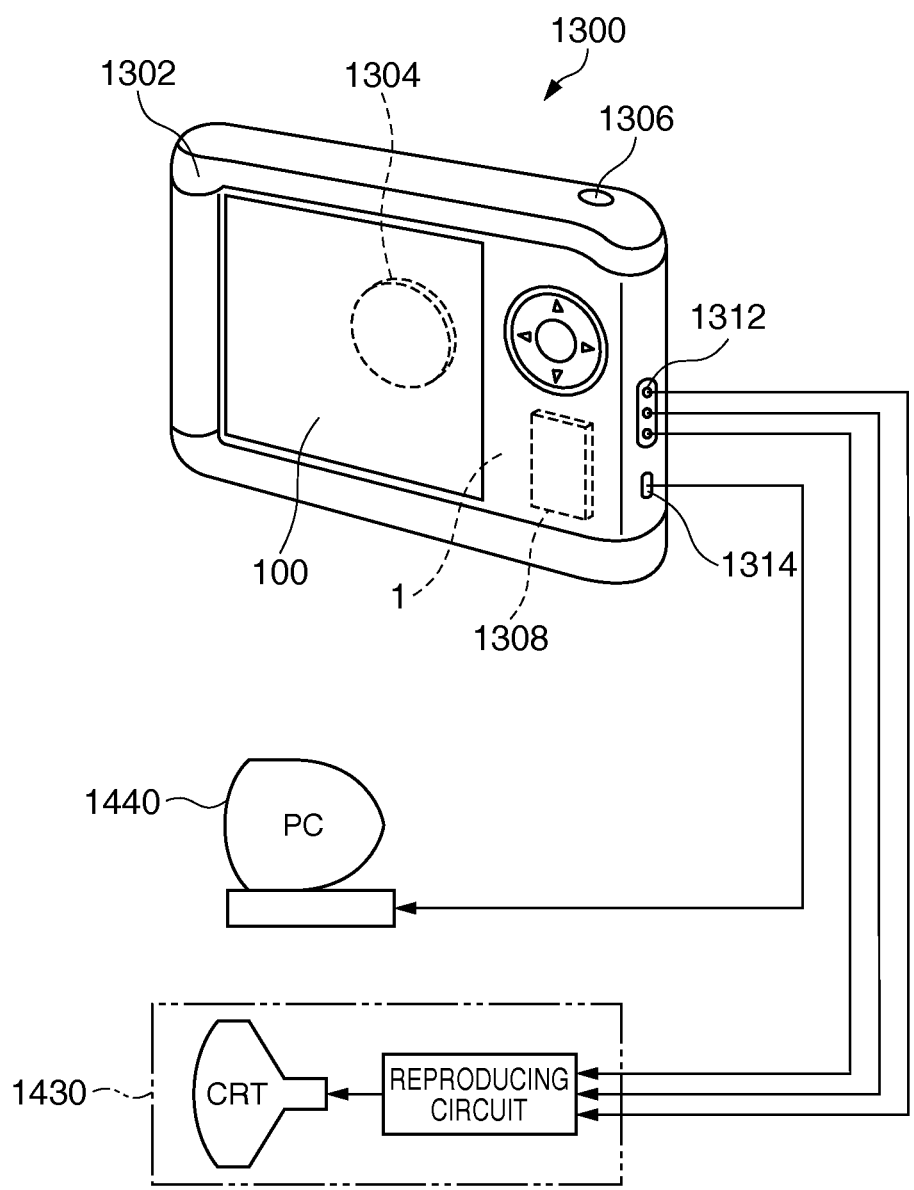
FIG. 12 is a perspective view showing a configuration of a digital still camera to which the electronic apparatus of the invention is applied.

FIG. 12 is a perspective view showing a configuration of a digital still camera to which the electronic apparatus according to the invention is applied. Note that, in the drawing, connection to an external device is simply shown.

Here, in a typical camera, a silver halide photographic film is exposed to light by an optical image of a subject, on the other hand, a digital still camera 1300 photoelectrically converts an optical image of a subject using an image sensing device such as a CCD (Charge Coupled Device) and generates imaging signals (image signals).

On a back surface of a case (body) 1302 in the digital still camera 1300, a display part is provided and adapted to display based on the imaging signals by the CCD, and the display part functions as a finder that displays the subject as an electronic image.

Further, on the front side (the rear side in the drawing) of the case 1302, a light receiving unit 1304 including an optical lens (imaging system), the CCD, etc. is provided.

When a photographer checks the subject image displayed on the display part and presses down a shutter button 1306, the imaging signals of the CCD at the time are transferred and stored into a memory 1308.

Further, in the digital still camera 1300, a video signal output terminal 1312 and an input/output terminal for data communication 1314 are provided on the side surface of the case 1302. Furthermore, as shown in the drawing, a television monitor 1430 is connected to the video signal output terminal 1312 and a personal computer 1440 is connected to the input/output terminal for data communication 1314, respectively, according to need. In addition, by predetermined operation, the imaging signals stored in the memory 1308 are output to the television monitor 1430 and the personal computer 1440.

The digital still camera 1300 contains the above described sensor device 1 that functions as a gyro sensor.

Note that the electronic apparatus according to the invention may be applied not only to the personal computer (mobile personal computer) in FIG. 10, the cellular phone in FIG. 11, and the digital still camera in FIG. 12 but also to a vehicle body position detection device, a pointing device, a head mounted display, an inkjet ejection device (for example, an inkjet printer), a laptop personal computer, a television, a video camera, a video tape recorder, a navigation system, a pager, a personal digital assistance (with or without communication function), an electronic dictionary, a calculator, an electronic game machine, a game controller, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, etc. in response to the electronic device.

The sensor element, the sensor device, and the electronic apparatus according to the invention have been explained according to the respective illustrated embodiments, however, the invention is not limited to those. The configurations of the respective parts may be replaced by arbitrary configurations having the same functions. Further, other arbitrary configurations may be added. Furthermore, the sensor device according to the invention may be formed by combining arbitrary two or more configurations (features) of the above described respective embodiments.

In addition, in the above described embodiments, the cases where the drive parts include piezoelectric elements have been explained, however, in the case where the vibrator is formed using a piezoelectric material, the drive parts may be excitation electrodes provided on the vibrating arms.

Further, the number of the vibrating arms may not be the numbers of the above described embodiments, but may be one to five, seven, or more.

The entire disclosure of Japanese Patent Application No. 2012-056457, filed Mar. 13, 2012, is expressly incorporated by reference herein.

What is claimed is:

1. A sensor element comprising:
   a base part;
   a vibrating arm extended from the base part; and
   a detection part that is provided above the vibrating arm and the base part and detects flexural vibration of the vibrating arm, wherein
   the detection part has a first electrode layer, a second electrode layer, and a piezoelectric layer provided between the first electrode layer and the second electrode and layer,
   the detection part bends or curves to extend in a direction including a direction component orthogonal to an extension direction of the vibrating arm along side surfaces of the vibrating arm and the base part,
   an end of the detection part at the base part side is located at an outer side of the vibrating arm than a virtual surface formed by extending the side surface of the vibrating arm along the extension direction of the vibrating arm, and
   when a width of the vibrating arm is Ws and a distance between the virtual surface and the end of the detection part at the base part side is Ls, Ls/Ws is equal to or less than 1.2.

2. The sensor element according to claim 1, wherein the detection part is provided so that a distance between the detection tart and the side surfaces of the vibrating arm and the base part constant.

3. The sensor element according to claim 1, further comprising:
   a detection vibrating arm forming the vibrating arm;
   a drive vibrating arm extended from the base part; and a drive part that is provided above the drive vibrating arm and flexurally vibrates the drive vibrating arm.

4. The sensor element according to claim 3, wherein the drive part has a piezoelectric element that expands and contracts in an extension direction of the drive vibrating arm, and
the drive part is provided above the drive vibrating arm and the base part, and bends or curves to extend in a direction including a direction component orthogonal to the extension direction of the drive vibrating arm along side surfaces of the drive vibrating arm and the base part.

5. The sensor element according to claim 3, wherein the base part has a main body part, and a pair of connecting arms extended from the main body part in opposite directions,
the drive vibrating arm is extended from each of the connecting arms in a direction crossing an extension direction of each of the connecting arms, and
the detection vibrating arm is extended from the main body part in a direction crossing the extension direction of each of the connecting arms.

6. A sensor device comprising the sensor element according to claim 1.

7. A sensor device comprising the sensor element according to claim 2.

8. A sensor device comprising the sensor element according to claim 3.

9. A sensor device comprising the sensor element according to claim 4.

10. A sensor device comprising the sensor element according to claim 5.

11. An electronic apparatus comprising the sensor element according to claim 1.

12. An electronic apparatus comprising the sensor element according to claim 2.

13. An electronic apparatus comprising the sensor element according to claim 3.

14. An electronic apparatus comprising the sensor element according to claim 4.

* * * * *